United States Patent [19]

Chung

[11] Patent Number: 5,759,886

[45] Date of Patent: Jun. 2, 1998

[54] METHOD FOR FORMING A LAYER OF METAL SILICIDE OVER THE GATES OF A SURFACE-CHANNEL CMOS DEVICE

[75] Inventor: Henry Wei-Ming Chung, Cupertino, Calif.

[73] Assignee: National Semiconductor Corporation, Santa Clara, Calif.

[21] Appl. No.: 649,932

[22] Filed: May 16, 1996

Related U.S. Application Data

[63] Continuation of Ser. No. 535,536, Sep. 28, 1995.

[51] Int. Cl.$^6$ .................................................. H01L 21/8238
[52] U.S. Cl. .................................................. 438/231; 438/655
[58] Field of Search ........................... 437/34, 44, 45, 437/56, 57, 58, 193, 200; 148/DIG. 1; 438/230, 231, 232, 233, 649, 655, 657

[56] References Cited

U.S. PATENT DOCUMENTS

| | | | |
|---|---|---|---|
| 5,010,032 | 4/1991 | Tang et al. | 437/57 |
| 5,190,888 | 3/1993 | Schwalke et al. | 437/200 |
| 5,212,542 | 5/1993 | Okumura | 437/34 |
| 5,468,669 | 11/1995 | Lee et al. | 437/56 |

*Primary Examiner*—Chandra Chaudhari
*Attorney, Agent, or Firm*—Limbach & Limbach L.L.P.

[57] ABSTRACT

Surface-channel NMOS and PMOS transistors are formed in a CMOS compatible process by implanting the substrate to form source and drain regions at the same time that the gate is implanted to set the conductivity of the gate. Following this, a layer of dielectric is deposited and baked to densify and reflow the dielectric. The baked dielectric is then etched to expose the top surface of the gates. Next, a metallic layer is formed over the top surface of the gates. In accordance with the present invention, by forming the metallic layer after the dielectric layer has been baked, the degradation of the metallic layer that results from the baking is eliminated.

34 Claims, 19 Drawing Sheets

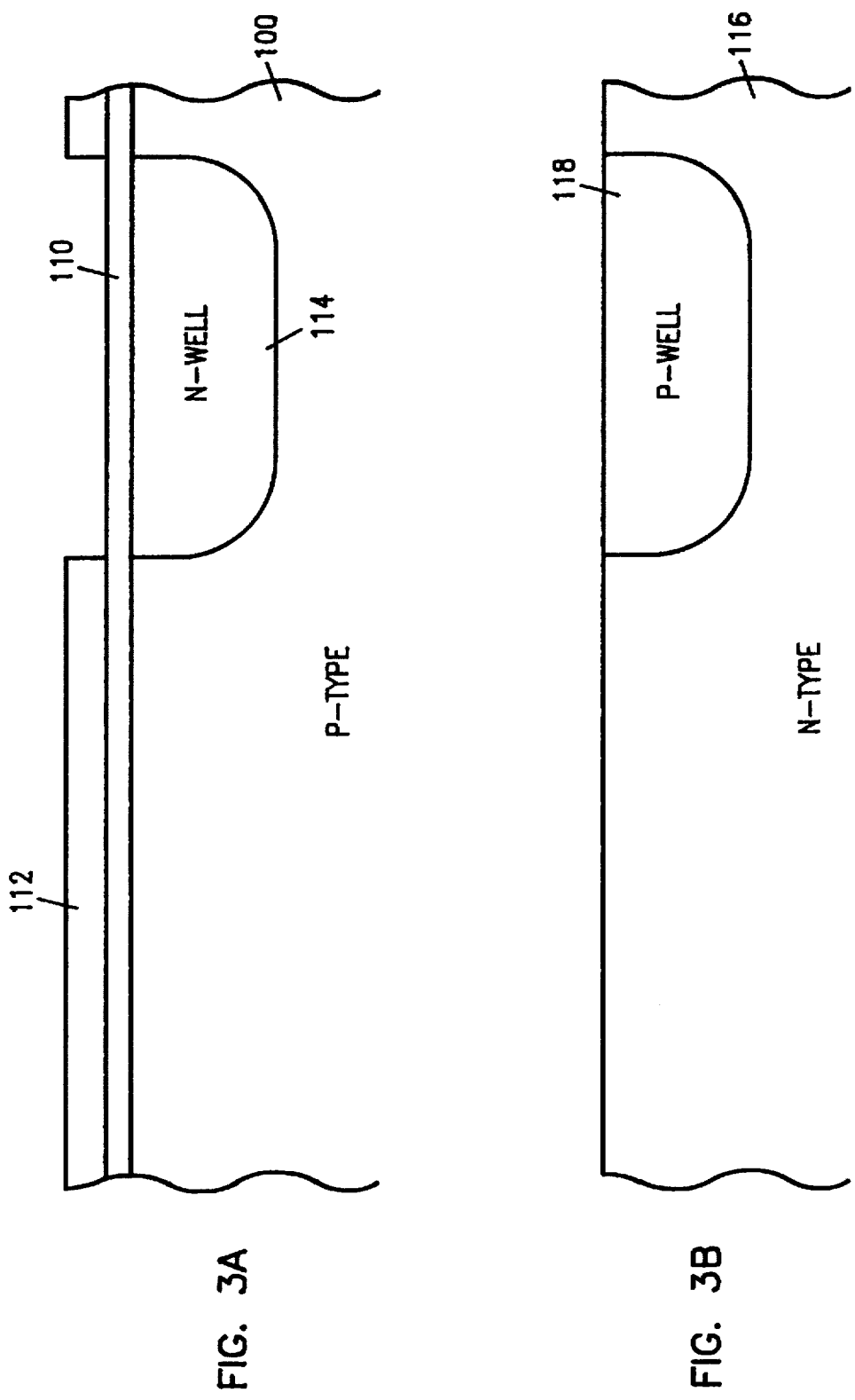

METHOD FOR FORMING A LAYER OF METAL SILICIDE OVER THE GATES OF A SURFACE-CHANNEL CMOS DEVICE

This is a continuation of co-pending application Ser. No. 08/535,536 filed on Sep. 28, 1995.

BACKGROUND OF THE INVENTION

1. Field of the Invention

The present invention relates to a method for forming NMOS and PMOS transistors and, more particularly, to a method for forming surface-channel NMOS and PMOS transistors in a CMOS compatible process.

2. Description of the Related Art

Conventional CMOS fabrication techniques produce surface-channel NMOS transistors and buried-channel PMOS transistors because the layer of deposited silicon which is subsequently etched to form the gates of both the NMOS and PMOS transistors is made N-type using a material such as $POCl_3$. More recently, however, the industry has been moving toward the use of surface-channel PMOS transistors to obtain a lower threshold voltage.

One technique for fabricating surface-channel NMOS and PMOS transistors is shown in FIGS. 1A-1E. As shown in FIG. 1A, this technique begins with the growth of a layer of gate oxide 12 on a semiconductor substrate 10 that has an N-well and a plurality of field oxide regions FOX. After the layer of gate oxide 12 has been formed, a layer of amorphous silicon 14 is then deposited.

Next, departing from conventional CMOS steps, a photoresist mask 15 is formed and patterned to expose the to-be-formed gates of the NMOS transistors. Following this, the exposed regions are implanted with arsenic or a similar material.

After the to-be-formed NMOS gates have been implanted, the NMOS photoresist mask 15 is stripped and a PMOS photoresist mask (not shown) is formed and patterned to expose the to-be-formed gates of the PMOS transistors. The exposed regions are then implanted with boron or a similar material. Following this, the PMOS photoresist mask is stripped.

Next, returning to conventional steps, a layer of tungsten silicide 16, which is used to reduce the resistance of the poly, is deposited over the layer of silicon 14, as shown in FIG. 1B, followed by the formation of a photoresist mask 18. As shown in FIG. 1C, the unmasked regions are then etched to form a plurality of gates 20 and a plurality of poly resistors 22.

Following this, mask 18 is stripped and an N-type implant mask (not shown) is formed to protect the to-be-formed p-channel transistors. After the implant mask is formed, the unmasked regions are implanted with a low dose of arsenic.

Next, the N-type implant mask is stripped, and a P-type implant mask (not shown) is formed to protect the to-be-formed n-channel transistors. After the implant mask is formed, the unmasked regions are implanted with a low dose of boron. Following this, the P-type implant mask is stripped and a layer of oxide (not shown) is deposited. The layer of oxide is then anisotropically etched to form spacers 28 as shown in FIG. 1D.

After spacers 28 have been formed, a second N-type implant mask 30 is formed to protect the to-be-formed p-channel transistors. After the implant mask 30 is formed, the unmasked regions are implanted with arsenic. A heat treatment at an elevated temperature is then done to active the arsenic and form the N-type source and drain regions.

Next, the second N-type implant mask 30 is stripped, and a second P-type implant mask (not shown) is formed to protect the to-be-formed n-channel transistors. After the implant mask is formed, the unmasked regions are implanted with boron to form the source and drain regions of the p-channel transistors. Following this, the second P-type implant mask is stripped.

As shown in FIG. 1E, after the second P-type implant mask has been removed, a heat treatment at an elevated temperature is done to active the boron and form the P-type source and drain regions. A layer of dielectric 32 containing boron and phosphorous is then deposited over the wafer. Next, the wafer is heated to 800°-900° C. for densification and reflow, and then polished using conventional chemical-mechanical techniques.

The major drawback of this approach is that two additional masking steps are required over the number of steps that are utilized for conventional CMOS processing. In addition, it is difficult to match the etch rates of the N-type and P-type polysilicon. As a result, it is difficult to control the critical poly dimensions.

Another technique for fabricating surface-channel NMOS and PMOS transistors is shown in FIGS. 2A-2E. As shown in FIG. 2A, this technique begins with the same steps as the previous technique with the growth of the layer of gate oxide 12, followed by the deposition of the layer of amorphous silicon 14.

In contrast to the previous technique, photoresist mask 18 is then formed over the undoped layer of silicon. As shown in FIG. 2B, the unmasked regions are then etched to form the plurality of gates 20 and the plurality of poly resistors 22.

Following this, the process follows the same steps as described above with respect to the low dose implant, the formation of spacers 28, and the formation of the source and drain regions. However, as shown in FIG. 2C, since the gates were patterned prior to the deposition of the tungsten silicide, the doping steps that form the source and drain regions also set the conductivity of the gates at the same time.

After the source and drain regions have been implanted, the layer of gate oxide 12 formed over the source and drain regions is removed, along with a portion of the top surface of gate 20. This is followed by the deposition of a layer of titanium (not shown). The layer of titanium is then annealed at a low temperature in $N_2$. The layer of titanium which is in contact with the gates, poly resistors, sources and drains interacts with the silicon to form titanium silicide. The remaining titanium interacts with the nitrogen to form titanium nitride.

Next, the titanium nitride is selectively stripped so that titanium silicide caps 34 are formed over the gate, source, and drain of the transistors, and over the poly resistors as shown in FIG. 2D. After removing the titanium nitride, the titanium silicide caps 34 are annealed at a high temperature to reduce the resistance of the titanium silicide 34.

Following this, as shown in FIG. 2E, a layer of dielectric 36 containing boron and phosphorous is deposited over the wafer. The wafer is then heated to 700°-900° C. for densification and reflow, and then polished with standard chemical-mechanical techniques.

One of the drawbacks with this approach is that the heating step, which is required to densify and reflow the dielectric, degrades the titanium silicide. In addition, there is a very small process window for the formation of the titanium silicide over the source and drain regions.

Thus, there is a need for a technique for forming both NMOS and PMOS surface-channel transistors that does not require additional masking steps and that does not degrade the titanium silicide.

SUMMARY OF THE INVENTION

The present invention provides a method for forming a layer of metal silicide over the polysilicon gates of a semiconductor device, such as a surface-channel CMOS device, that reduces or eliminates the limitations present in conventional polycide and salicide fabrication processes.

In the present invention, the method begins by forming a layer of insulation material over the semiconductor device so that the polysilicon gates are covered by the layer of insulation material. Next, the layer of insulation material is selectively removed to expose the top surfaces of the polysilicon gates. Once exposed, a layer of metal is deposited over the layer of insulation material and the exposed top surfaces of the polysilicon gates. Following this, the layer of metal is reacted with the polysilicon gates in an ambient of nitrogen to form a layer of metal silicide over the top surfaces of the polysilicon gates, and a layer of metal nitride over the layer of insulation material. The layer of metal nitride is then removed, and the process continues with conventional back-end processing steps.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 3A–3K show cross-sectional diagrams illustrating the steps for forming surface-channel NMOS and PMOS transistors in accordance with the present invention.

DETAILED DESCRIPTION

Figure 1A:
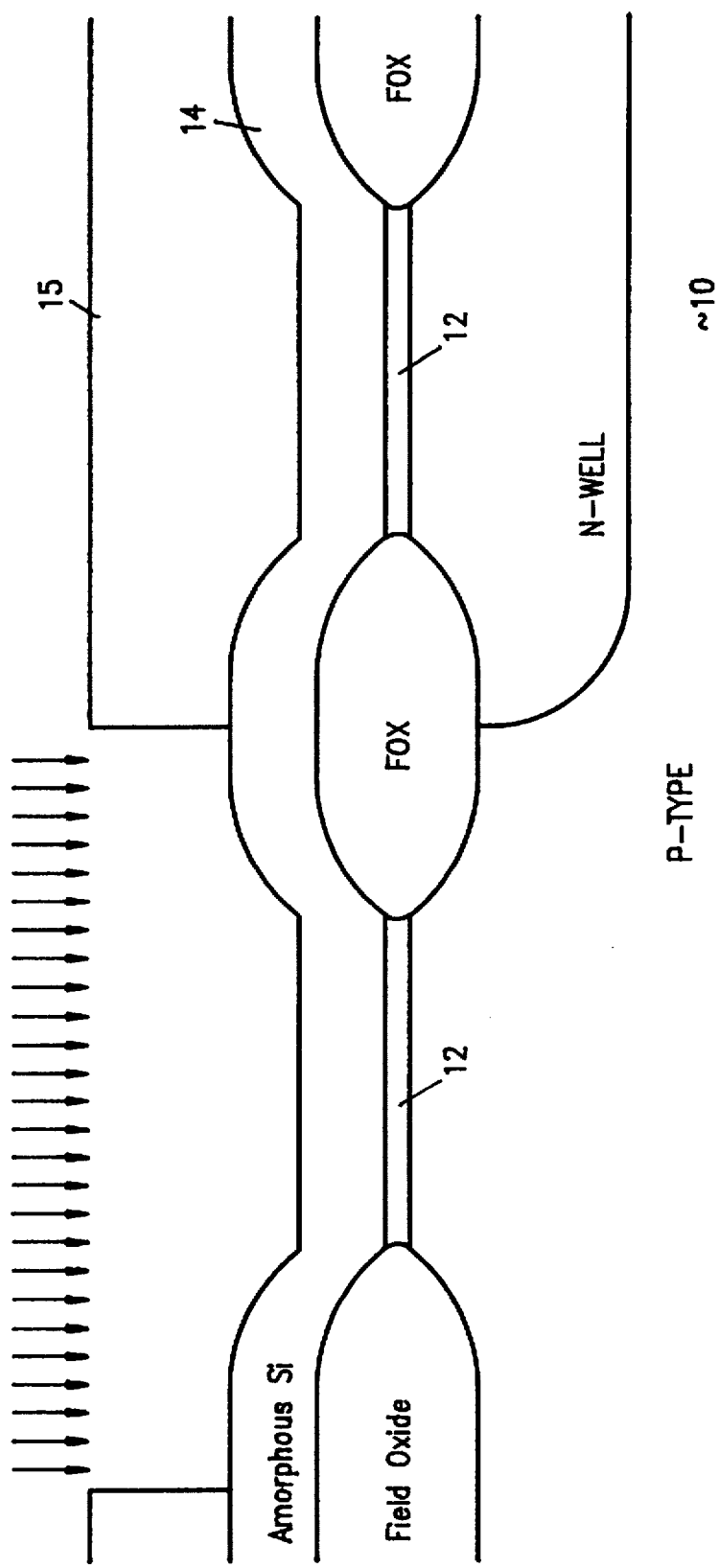
FIGS. 1A–1E show cross-sectional drawings illustrating a first technique for fabricating surface-channel NMOS and PMOS transistors.
Figure 1B:
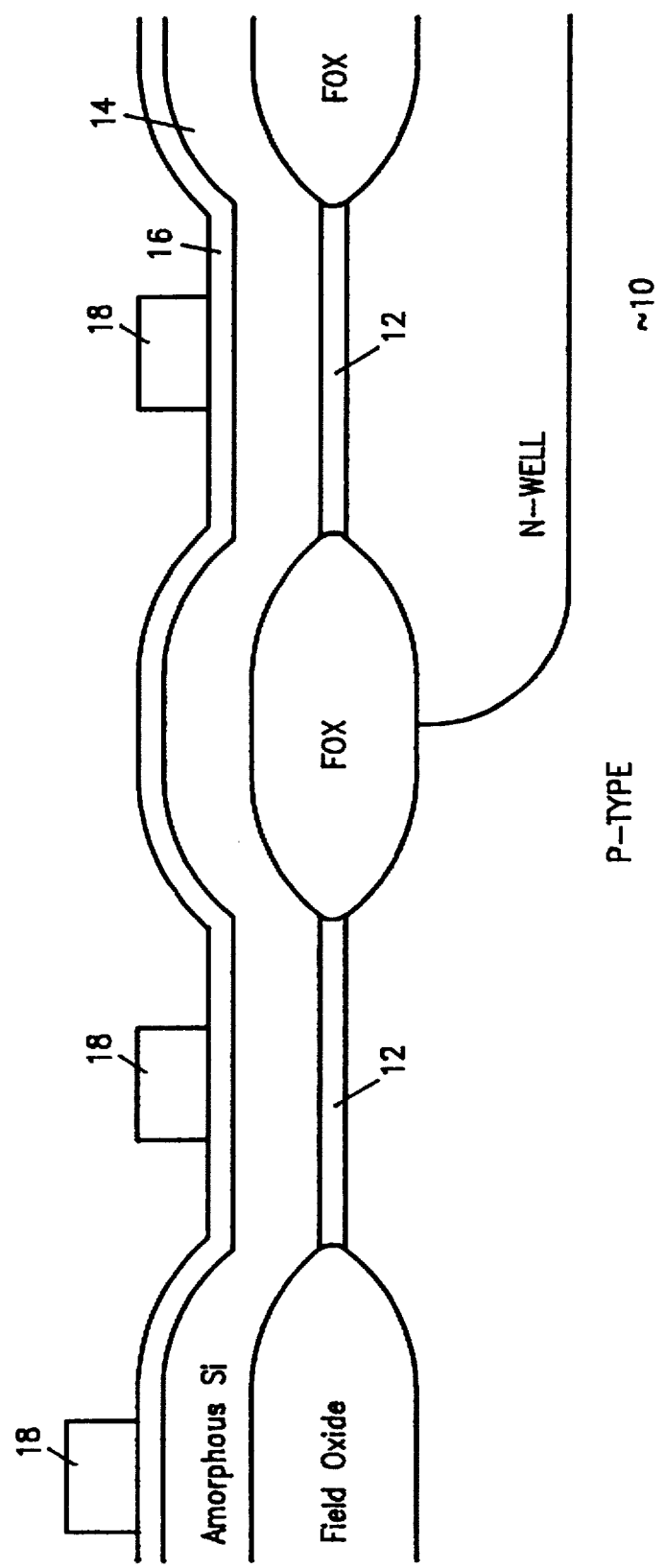
Figure 1C:
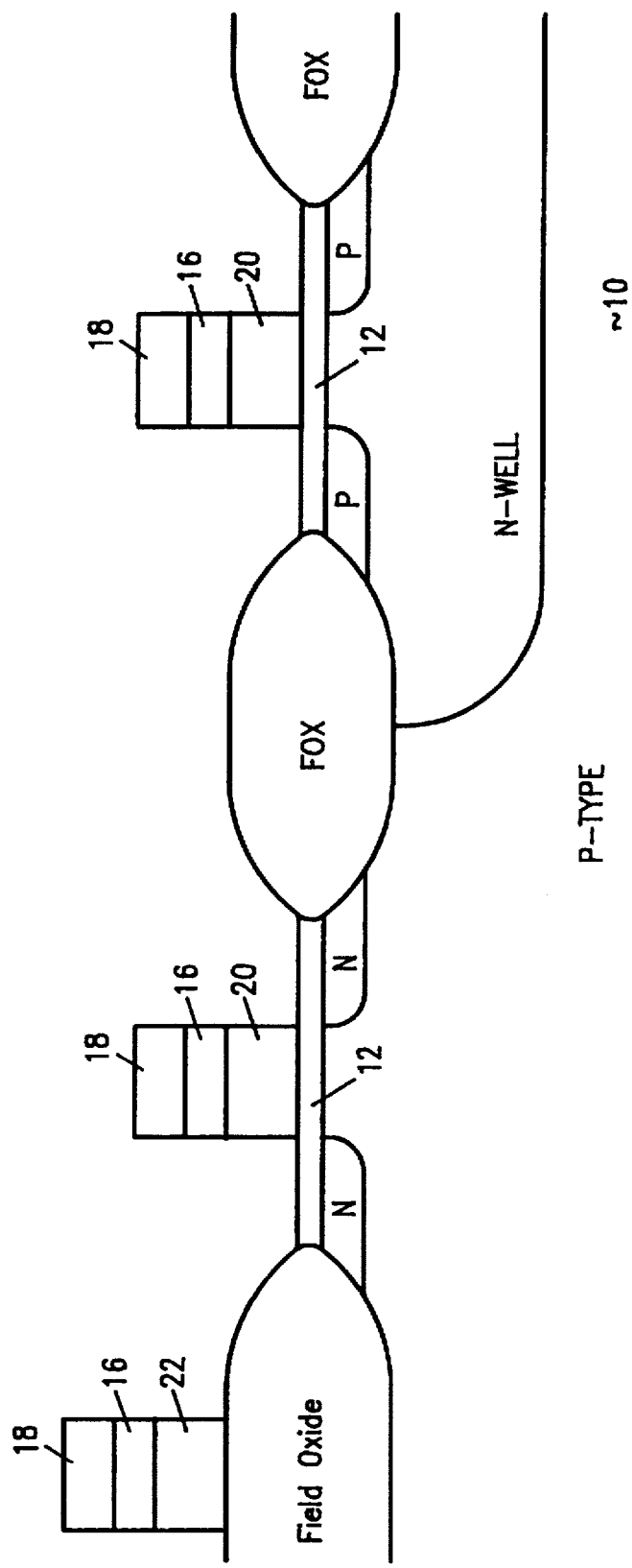
Figure 1D:
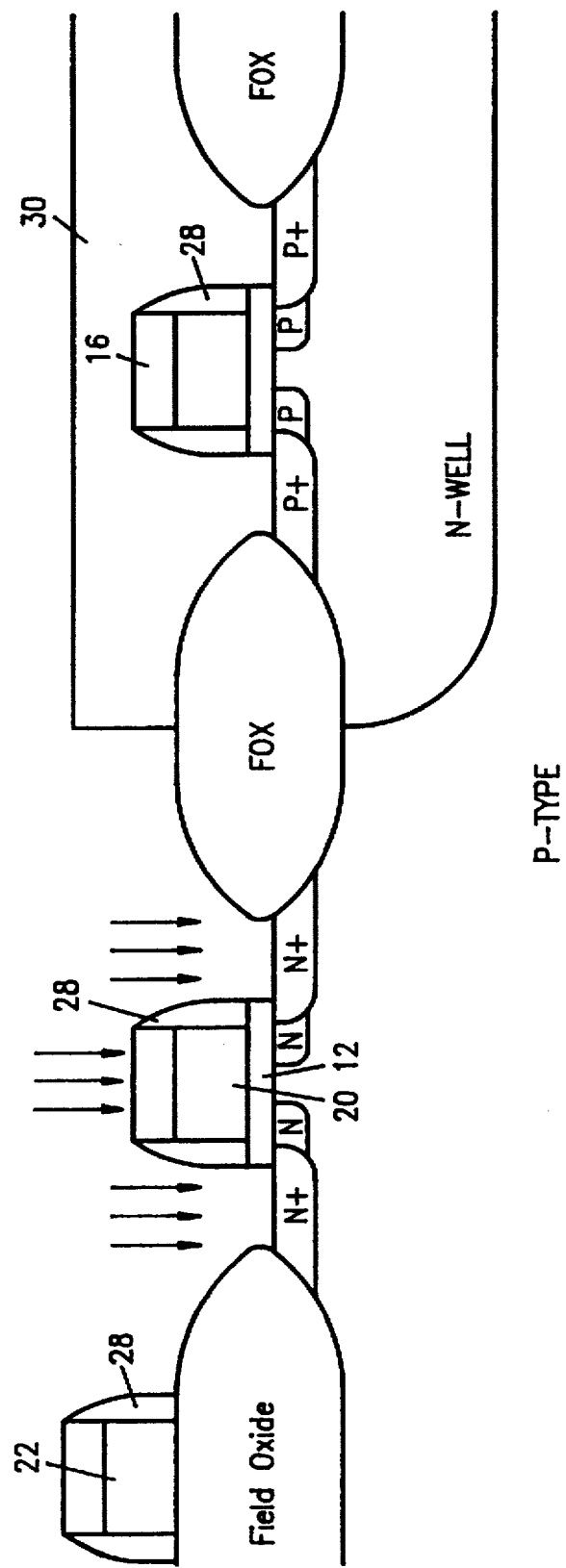
Figure 1E:
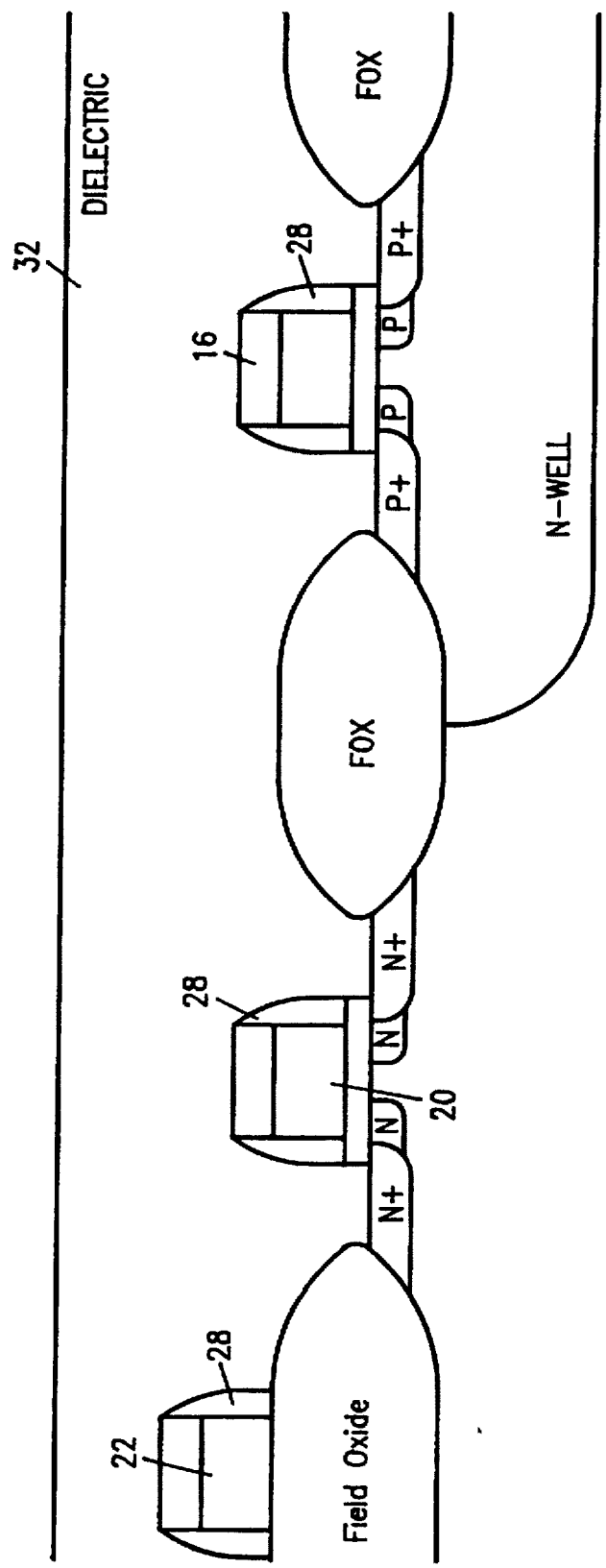
Figure 2A:
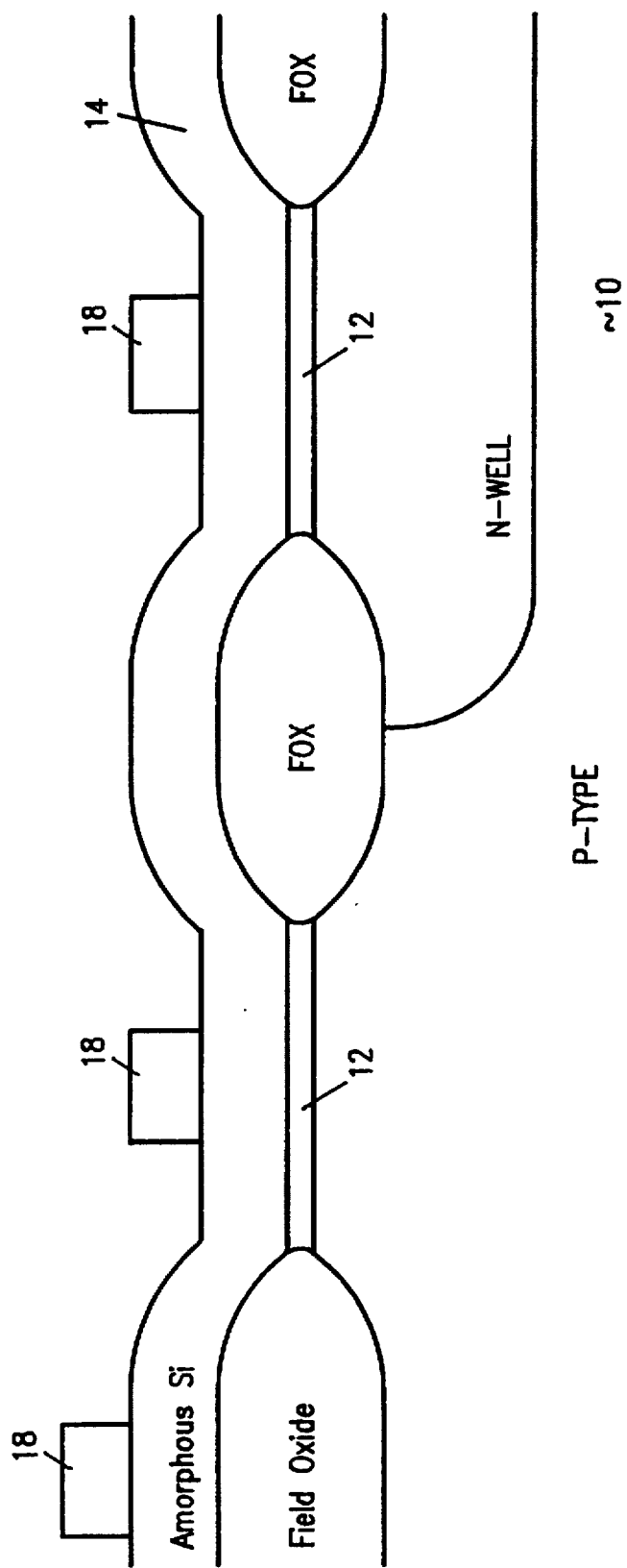
FIGS. 2A–2E show cross-sectional drawings illustrating a second technique for fabricating surface-channel NMOS and PMOS transistors.
Figure 2B:
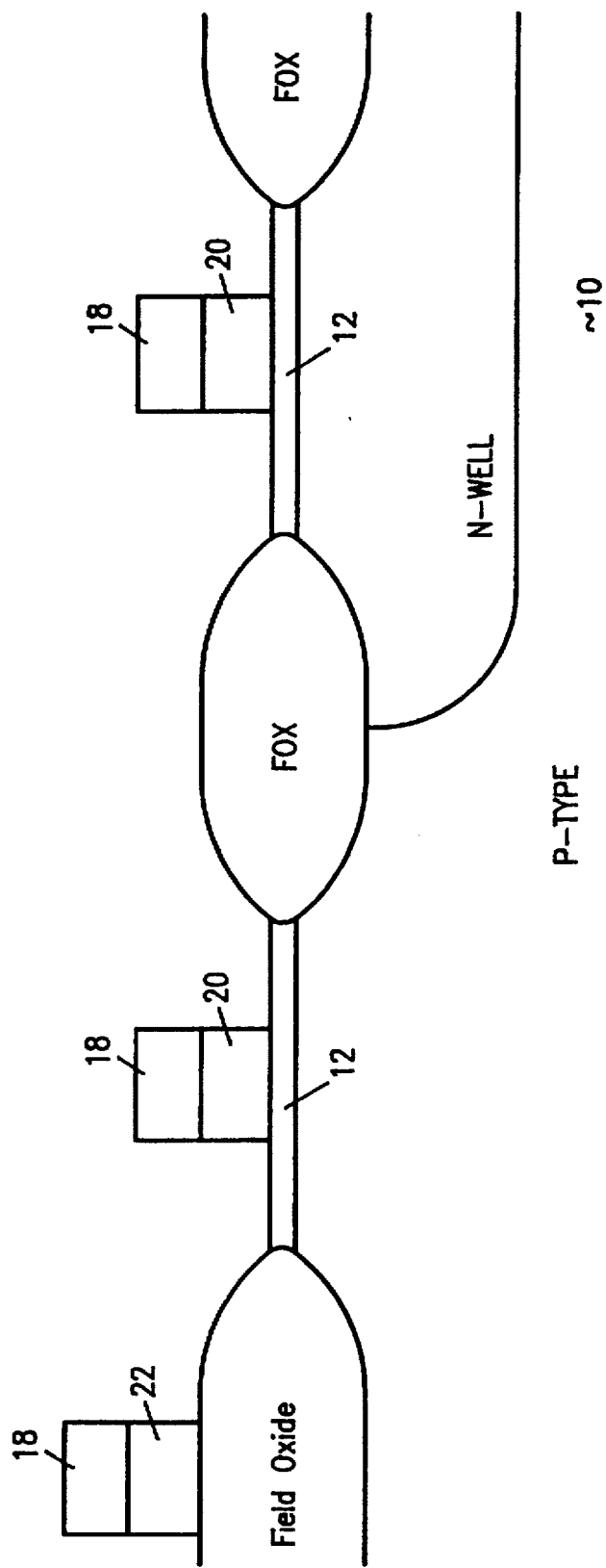
Figure 2C:
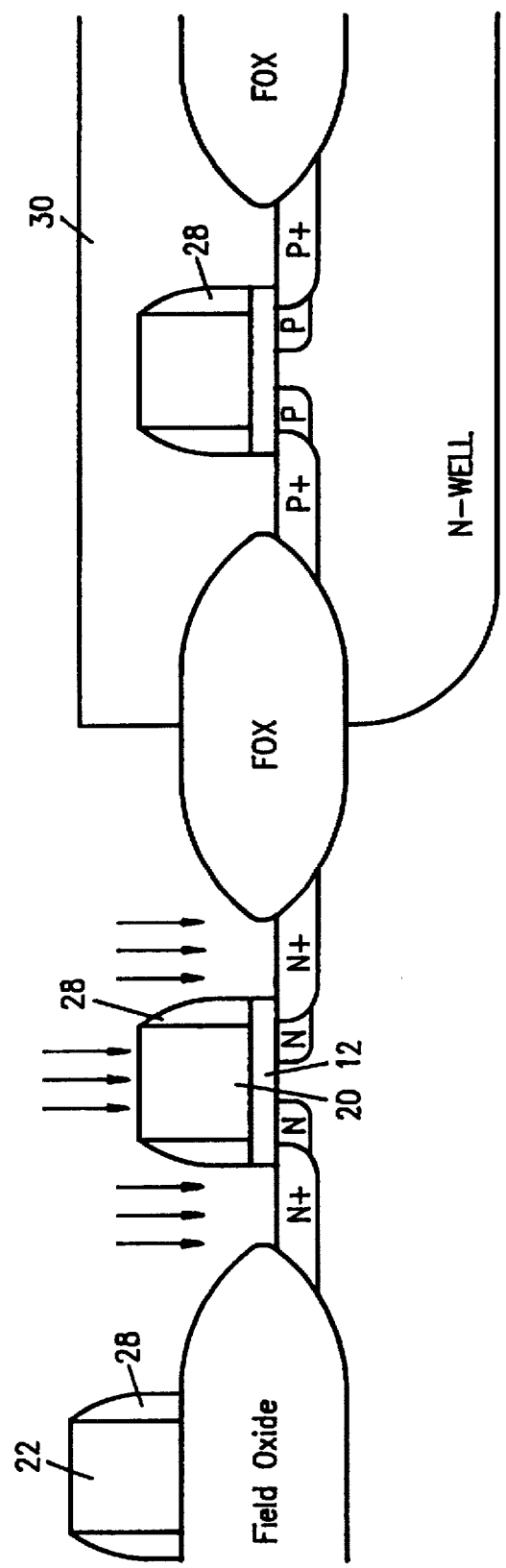
Figure 2D:
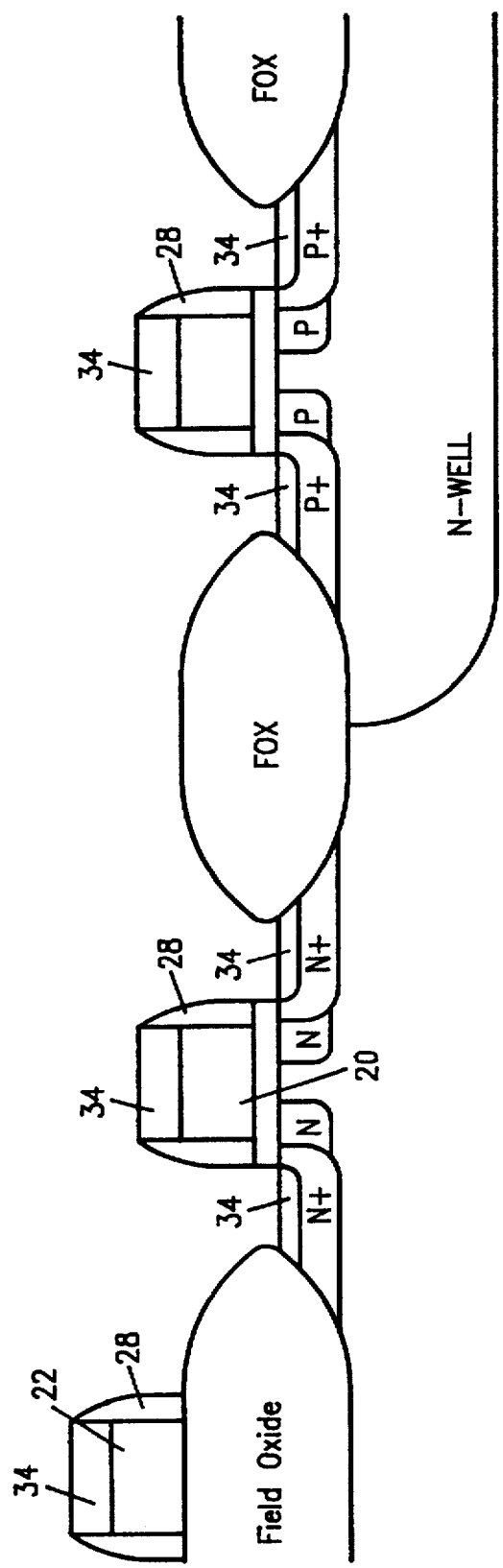
Figure 2E:
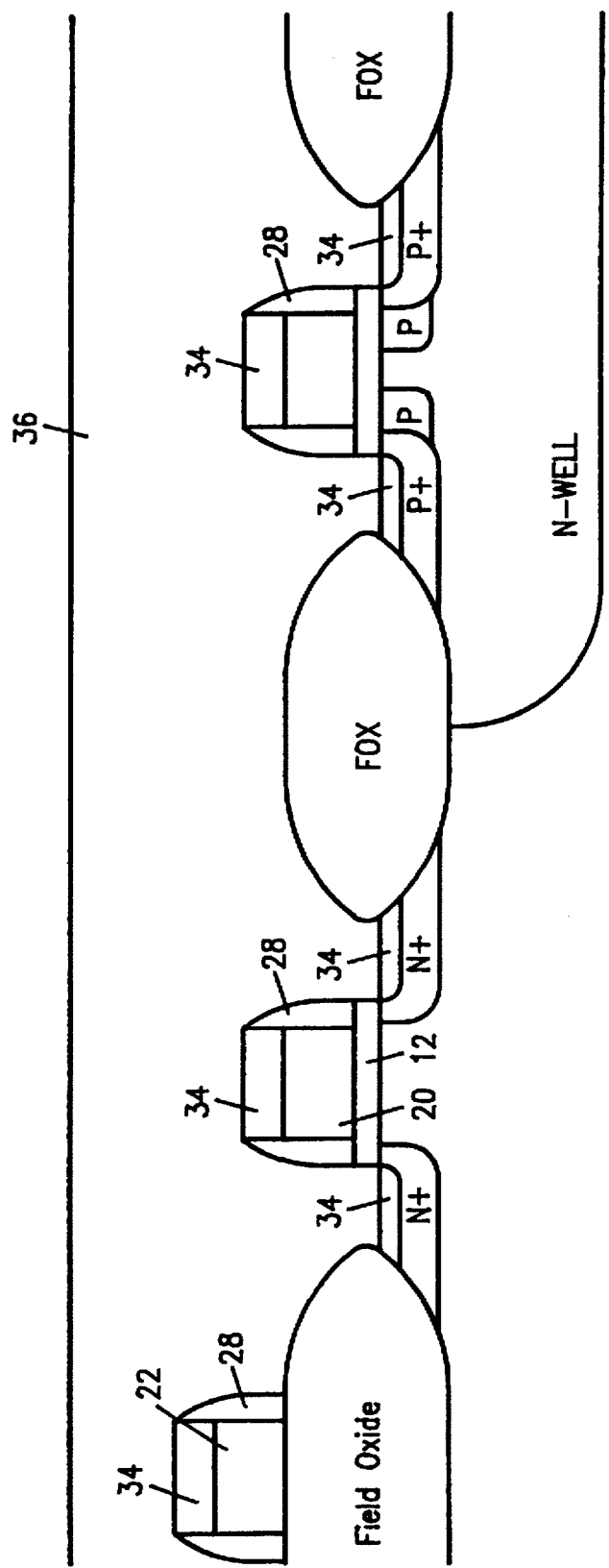
Figure 3C:
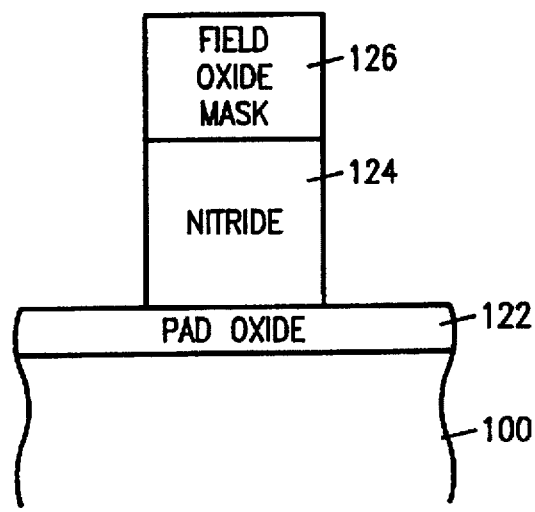

FIGS. 3A–3K show cross-sectional diagrams that illustrate the steps for forming surface-channel NMOS and PMOS transistors in accordance with the present invention. The process of the present invention begins with the formation of an N-well in a P-type semiconductor substrate. As shown in FIG. 3A, the N-well is first formed by growing a layer of oxide 110 approximately 500 Å thick over a semiconductor substrate 100. An N-type implant mask 112 is then formed over the layer of oxide 110 and patterned to define an N-type implant region. Following this, an N-type dopant is implanted into the unmasked areas to define an N-well 114.

Once N-well 114 has been formed, the N-type implant mask 112 is stripped and a drive-in step is performed to further define N-well 114. Following the drive-in step, the layer of oxide 110 is removed. The fabrication steps utilized to form N-well 114 are conventional and well known in the art. Alternately, as shown in FIG. 3B, a P-well 118 can formed in a substrate 116 of N-type conductivity.

The next step, following the formation of N-well 114, is the formation of a plurality of field oxide regions. As shown in FIG. 3C, the field oxide regions are first formed by growing a layer of pad oxide 122 approximately 200 Å thick over substrate 100. This is followed by the deposition of an overlying layer of nitride 124 approximately 2,000 Å thick. Next, a field oxide mask 126 is formed over the nitride/pad oxide composite and patterned to define a plurality of spaced-apart field oxide regions FOX.

Following this, the unmasked areas are etched until the underlying layer of nitride 124 is removed. As a result of this etching step, a plurality of pad oxide regions are exposed. After the unmasked layer of nitride 124 has been removed, the field oxide mask is stripped.

Figure 3D:
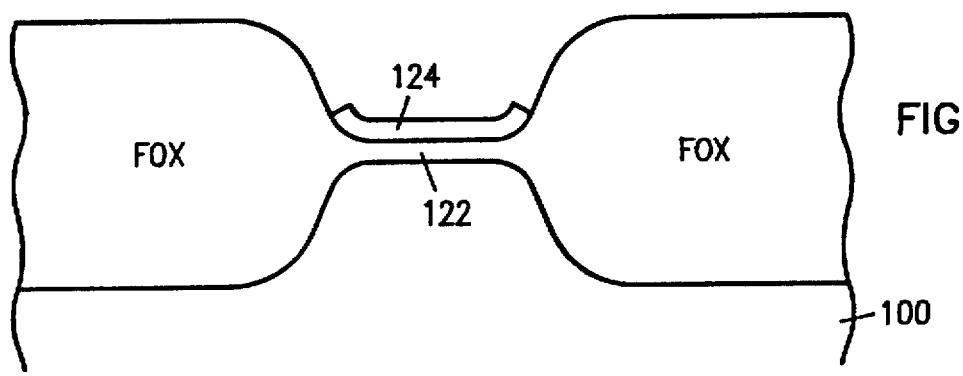

Referring to FIG. 3D, after the pad oxide regions have been implanted, the resulting device is oxidized to form the field oxide regions FOX. The fabrication steps utilized to form the field oxide regions FOX are conventional and well known in the art.

Once the field oxide regions FOX have been formed, the next step is to set the channel threshold voltages for the to-be-formed field-effect transistors. The threshold voltages are set by first removing the nitride/pad oxide composite layer. Next, a layer of sacrificial oxide (not shown) is grown on the exposed substrate 100. Following this, a threshold voltage mask is formed over the layer of sacrificial oxide and patterned.

After the threshold voltage mask has been formed and patterned, the semiconductor substrate 100 underlying the unmasked areas of sacrificial oxide is implanted with boron at 40 KeV to form an implant concentration of approximately $5 \times 10^{12}/cm^2$. Following this, the threshold voltage mask is stripped and the layer of sacrificial oxide is removed. The fabrication steps utilized to set the channel threshold voltages are also conventional and well known in the art.

Figure 3E:
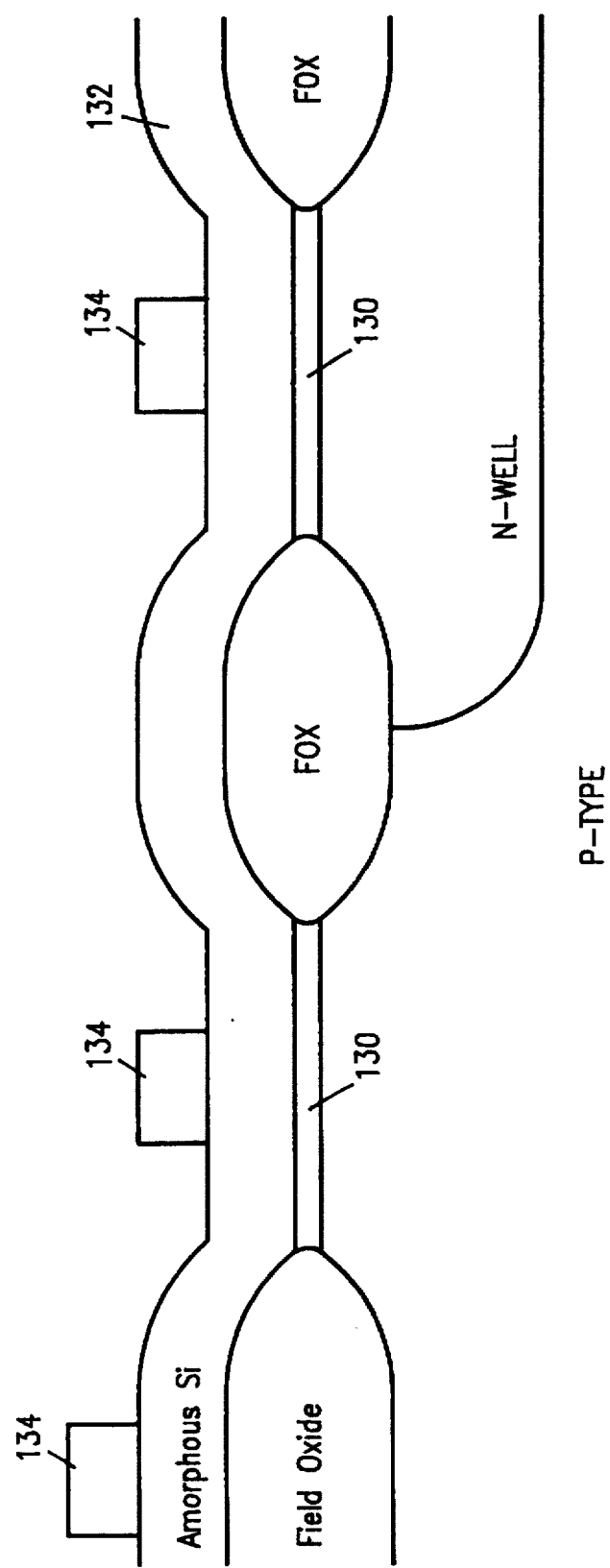

After the layer of sacrificial oxide has been removed, the next step is the formation of the gates. As shown in FIG. 3E, the gates are first formed by growing a layer of gate oxide 130 approximately b 80–100Å thick over substrate 100. Following this, a layer of amorphous silicon 132 approximately 2,000 Å thick is deposited over the layer of gate oxide 130 and the field oxide regions FOX. Next, a photoresist mask 134 is formed and patterned over the layer of silicon 132.

Figure 3F:
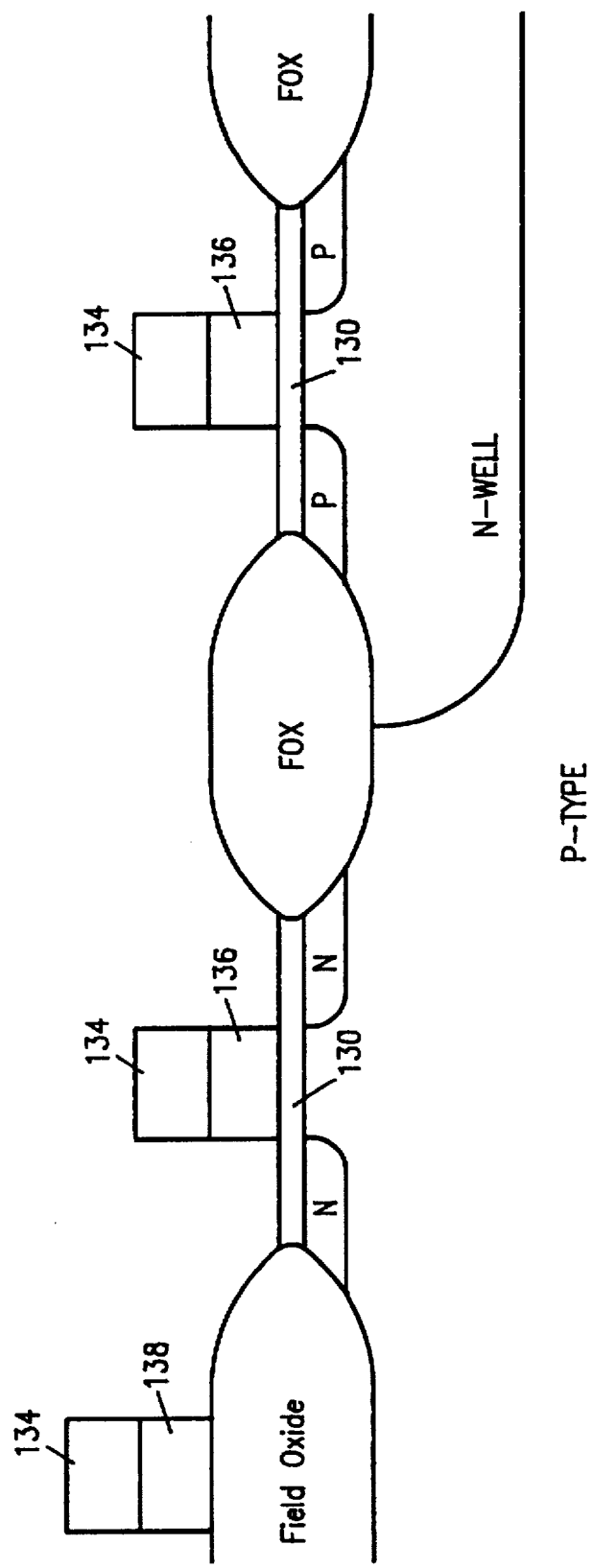

As shown in FIG. 3F, the unmasked layer of silicon 132 is then etched to form a plurality of gates 136 as well as a plurality of poly resistors 138. Following this, mask 134 is stripped and an N-type implant mask (not shown) is formed to protect the to-be-formed p-channel transistors. After the implant mask is formed, the unmasked regions are implanted with a low dose of arsenic through the layer of gate oxide 130.

Figure 3G:
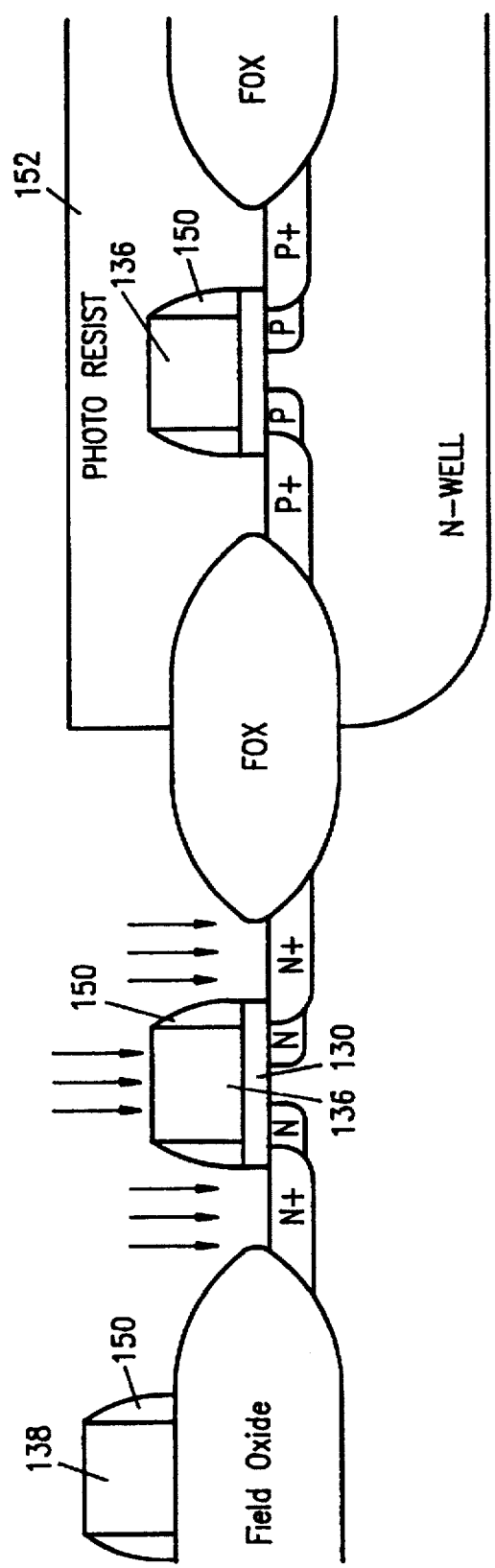

Next, the N-type implant mask is stripped, and a P-type implant mask (not shown) is formed to protect the to-be-formed n-channel transistors. After the implant mask is formed, the unmasked regions are implanted with a low dose of boron through the layer of gate oxide 130. Following this, the P-type implant mask is stripped and a layer of oxide (not shown) is deposited. The layer of oxide is then anisotropically etched to form spacers 150 as shown in FIG. 3G.

After spacers 150 have been formed, a second N-type implant mask 152 is formed to protect the to-be-formed p-channel transistors. After the implant mask 152 is formed, the unmasked regions are implanted with arsenic at 40 KeV to form an implant concentration of approximately $5 \times 10^{12}/cm^2$. This step forms the source and drain regions and sets the conductivity of the gates of the n-channel transistors.

Next, the second N-type implant mask 152 is stripped, and a second P-type implant mask (not shown) is formed to protect the n-channel transistors. After the implant mask is formed, the unmasked regions are implanted with boron at 40 KeV to form an implant concentration of approximately $5\times10^{12}/cm^2$. This step forms the source and drain regions and sets the conductivity of the gates of the p-channel transistors. Following this, the second P-type implant mask is stripped.

Figure 3H:
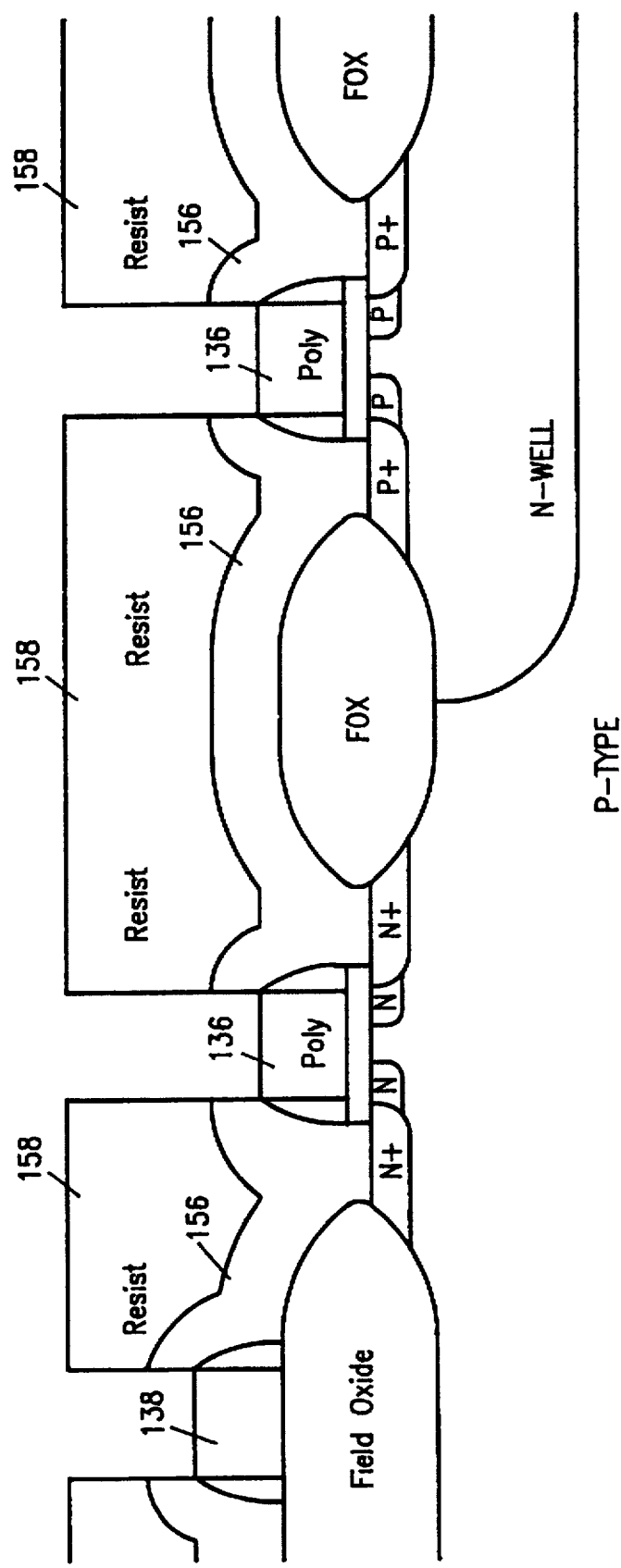

As shown in FIG. 3H, after the second P-type implant mask has been removed, a second layer of dielectric 156 is deposited. In the present invention, atmospheric or sub-atmospheric TEOS/ozone, BPSG, or other similar materials can be used to form dielectric 156. Next, the wafer is heated to 700°–900° C. for densification and reflow of dielectric 156. Following this, a photoresist mask 158 is formed and patterned over the layer of dielectric 156 to expose the gates 136 and poly resistors 138. Once mask 158 is in place, the wafer is etched until the layer of dielectric 156 is removed from the top surface of the gates 136 and poly resistors 138.

Figure 3I:
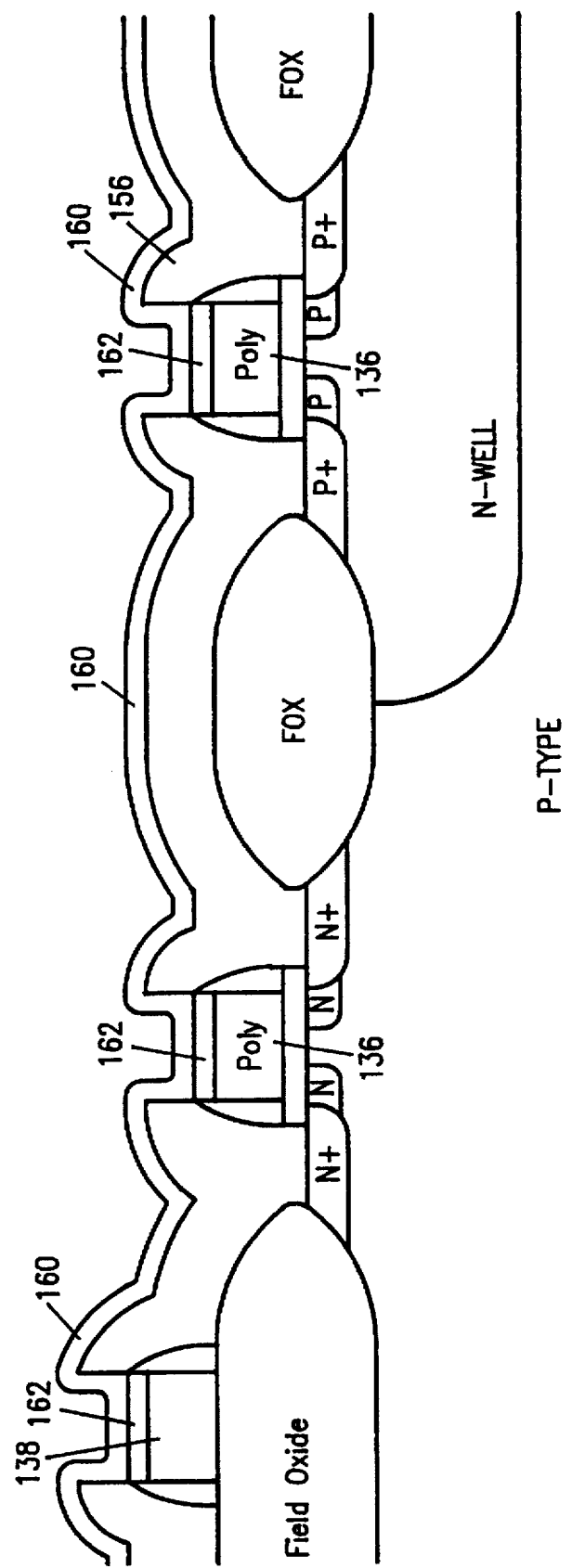
Figure 3J:
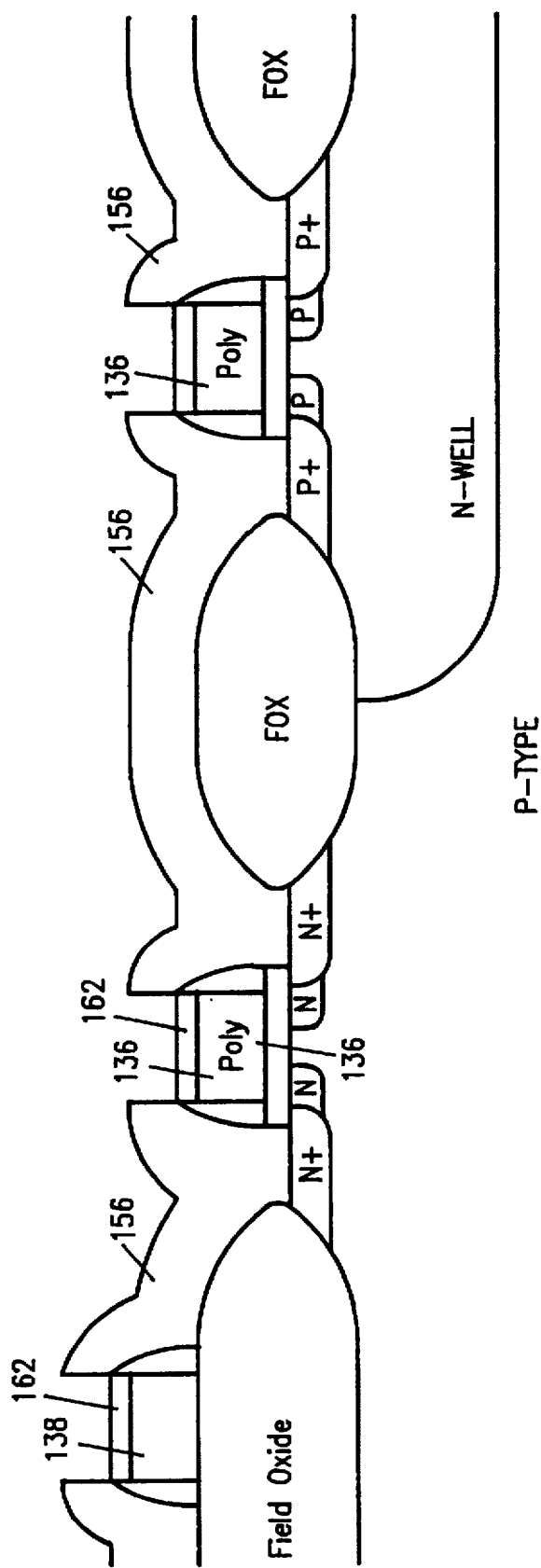

Next, as shown in FIG. 3I, mask 158 is removed, followed by the deposition of a layer of titanium 160. Following this, the wafer is annealed at 600°–700° C. in $N_2$. After annealing the wafer, the titanium in contact with the gates and the poly resistors interacts with the polysilicon to form titanium silicide 162. The remaining titanium interacts with the nitrogen to form titanium nitride. The exposed layer of titanium nitride is then selectively etched so that the titanium silicide 162 remains intact as shown in FIG. 3J.

Figure 3K:
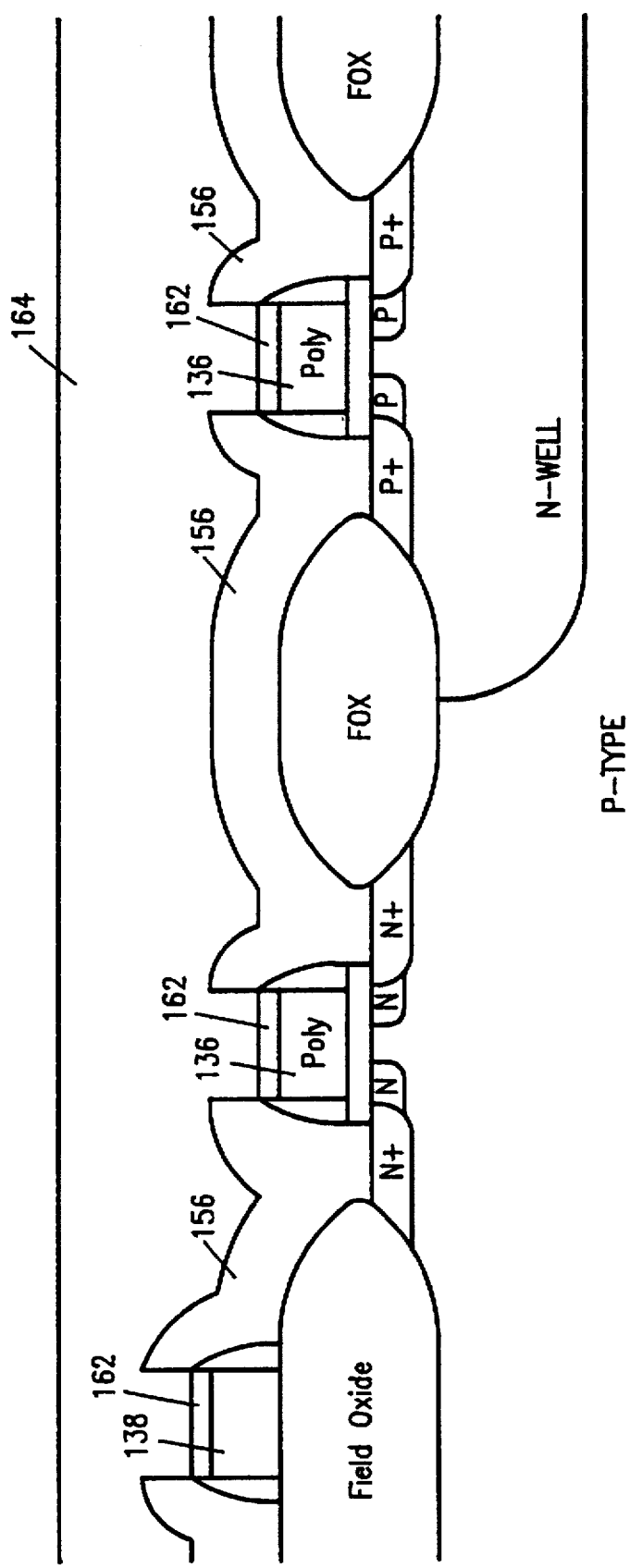

After the layer of titanium nitride has been removed from the layer of dielectric 156, the wafer is annealed at 700°–850° C. in $N_2$ or Argon to reduce the resistance of the titanium silicide 162. Next, as shown in FIG. 3K, a layer of oxide 164 is deposited over the wafer and polished using conventional chemical-mechanical polishing techniques. After the layer of oxide 164 has been deposited and polished, fabrication continues with conventional steps.

Thus, in accordance with the present invention, by depositing the layer of titanium after the layer of dielectric 156 has been densified and reflowed, the problems associated with heating the layer of titanium to 700°–900° C. are eliminated.

One of the advantages of the present invention is that the titanium silicide is formed in a self-aligned manner, i.e., no masking steps are necessary. In addition, cobalt or nickel can also be used in the place of the titanium to form a self-aligned silicide.

Further, mask 158 is not necessary if all of the poly resistors and the gates can be made at the same level using, for example, trench isolation rather than the conventional LOCOS isolation.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming surface-channel NMOS and PMOS transistors on a semiconductor substrate, the method comprising the steps of:

defining a plurality of transistor regions in the substrate;

forming a first layer of dielectric over the substrate;

forming a layer of silicon over the first layer of dielectric;

etching the layer of silicon to form a plurality of spaced-apart gates over the first layer of dielectric so that a gate is formed in each transistor region, each of the plurality of gates having sidewalls;

depositing a second layer of dielectric over the first layer of dielectric, and the plurality of gates;

etching the second layer of dielectric to form spacers adjoined to the sidewalls of the gates;

implanting the substrate to form spaced-apart source and drain regions adjacent to each gate, and to set a conductivity of the gates;

depositing a third layer of dielectric over the the spacers and the gates;

etching the third layer of dielectric to expose the top surfaces of the gates;

depositing a metallic layer over the third layer of dielectric and the exposed top surfaces of the gates;

annealing the metallic layer, the gates, and the third layer of dielectric to form a first layer of material over the gates, and a second layer of material over the third layer of dielectric; and removing the second layer of material.

2. The method of claim 1 wherein the metallic layer includes titanium.

3. A method for forming a layer of metal silicide on a semiconductor device formed in a substrate of a first conductivity type, the device including:

a plurality of active device regions defined in the substrate, a plurality of spaced-apart conductive regions formed in the substrate so that a pair of conductive regions is formed in each active device region, the conductive regions defining a plurality of substrate channel regions such that each pair of conductive regions in an active device region defines a corresponding substrate channel region therebetween, a plurality of gate oxide regions formed over the plurality of substrate channel regions such that each gate oxide region is formed over a corresponding substrate channel region, a plurality of polysilicon gates formed over the plurality of gate oxide regions such that each polysilicon gate is formed over a corresponding gate oxide region, the polysilicon gates having sidewalls and top surfaces, a plurality of spacers formed such that the sidewalls of the polysilicon gates are covered with spacers, the method comprising the steps of:

depositing a layer of insulation material over the polysilicon gates and the spacers;

selectively removing the layer of insulation material to expose the top surfaces of the polysilicon gates;

depositing a layer of metal over the layer of insulation material and the top surfaces of the polysilicon gates; and reacting the layer of metal with the polysilicon gates to form a layer of metal silicide over the top surfaces of the polysilicon gates.

4. The method of claim 3 wherein the reacting step includes heating the device in an ambient of $N_2$.

5. The method of claim 4 wherein the reacting step further forms a layer of metal nitride.

6. The method of claim 5 and further comprising the step of removing the layer of metal nitride, thereby leaving the layer of metal silicide over the top surfaces of the polysilicon gates.

7. The method of claim 3 wherein the layer of metal includes titanium.

8. The method of claim 3 wherein the layer of metal includes cobalt.

9. The method of claim 3 wherein the layer of metal includes nickel.

10. The method of claim 3 wherein the layer of insulation material includes an oxide.

11. The method of claim 3 wherein a first plurality of the polysilicon gates is doped to have the first conductivity type, and a second plurality of the polysilicon gates is doped to have a second conductivity type.

12. The method of claim 11 wherein the reacting step includes heating the device in an ambient of $N_2$.

13. The method of claim 12 wherein the reacting step further forms a layer of metal nitride.

14. The method of claim 13 and further comprising the step of removing the layer of metal nitride, thereby leaving the layer of metal silicide over the top surfaces of the polysilicon gates.

15. The method of claim 11 wherein the layer of metal includes titanium.

16. The method of claim 11 wherein the layer of metal includes cobalt.

17. The method of claim 11 wherein the layer of metal includes nickel.

18. A method for forming a layer of metal silicide over a semiconductor device having:

a polysilicon structure having an exposed top surface and a sidewall, and an oxide spacer contacting the sidewall of the polysilicon structure, the method comprising the steps of:

forming a layer of insulation material over the semiconductor device to cover the exposed top surface of the polysilicon structure and the oxide spacer;

selectively removing the layer of insulation material to reexpose the top surface of the polysilicon structure;

depositing a layer of metal over the layer of insulation material and the reexposed top surface of the polysilicon structure; and reacting the layer of metal with the polysilicon structure to form a layer of metal silicide over the top surface of the polysilicon structure.

19. The method of claim 18 wherein the layer of metal includes titanium.

20. The method of claim 1 wherein the implanting step further includes the steps of:

implanting the substrate to form spaced-apart source and drain regions of a first conductivity type adjacent to each of a first plurality of gates, and to set a conductivity of the first plurality of gates to the first conductivity type; and implanting the substrate to form spaced-apart source and drain regions of a second conductivity type adjacent to each of a second plurality of gates, and to set a conductivity of the second plurality of gates to the second conductivity type.

21. The method of claim 1 and further comprising the step of forming field oxide in the substrate to isolate adjacent transistor regions.

22. The method of claim 21 wherein the layer of silicon is formed over the field oxide, wherein the etching step that forms the plurality of spaced-apart gates also forms resistors over the field oxide, and wherein the implanting step that sets the conductivity of the gates also sets the conductivity of the resistors.

23. The method of claim 1 wherein the first, second, and third layers of dielectric are formed from oxide.

24. The method of claim 1 wherein the layer of silicon is amorphous silicon.

25. The method of claim 1 wherein the first layer of material includes a metal silicide.

26. The method of claim 3 and further comprising the step of forming field oxide in the substrate to isolate adjacent active regions.

27. The method of claim 18 wherein the reacting step includes heating the device in an ambient of $N_2$.

28. The method of claim 26 wherein the field oxide includes trenched field oxide.

29. The method of claim 18 wherein the reacting step further forms a layer of metal nitride.

30. The method of claim 29 and further comprising the step of removing the layer of metal nitride, thereby leaving the layer of metal silicide over the top surface of the polysilicon structure.

31. A method for forming a layer of metal silicide over a semiconductor device having a polysilicon structure, the polysilicon structure having a top surface that is exposed to form an exposed top surface, the method comprising the steps of:

forming a layer of insulation material over the semiconductor device to cover the exposed top surface of the polysilicon structure;

forming a mask over the layer of insulation material;

patterning the mask to have an opening substantially in register with the top surface of the polysilicon structure;

removing the layer of insulation material defined by the opening in the mask to reexpose the top surface of the polysilicon structure to form a reexposed top surface;

removing the mask;

depositing a layer of metal over the layer of insulation material and the reexposed top surface of the polysilicon structure; and reacting the layer of metal with the polysilicon structure to form a layer of metal silicide over the top surface of the polysilicon structure.

32. The method of claim 31 wherein the reacting step includes heating the device in an ambient of $N_2$.

33. The method of claim 31 wherein the reacting step further forms a layer of metal nitride.

34. The method of claim 33 and further comprising the step of removing the layer of metal nitride, thereby leaving the layer of metal silicide over the top surface of the polysilicon structure.

* * * * *

UNITED STATES PATENT AND TRADEMARK OFFICE
CERTIFICATE OF CORRECTION

PATENT NO.: 5,759,886
DATED: June 2, 1998
INVENTOR(S): Henry Wei-Ming Chung

It is certified that error appears in the above-identified patent and that said Letters Patent is hereby corrected as shown below:

In Col. 6, line 6, after "over" delete the first occurrence of "the".

Signed and Sealed this

Eighteenth Day of August, 1998

Attest:

BRUCE LEHMAN

*Attesting Officer*  *Commissioner of Patents and Trademarks*